United States Patent
Yamaguchi

(10) Patent No.: US 12,021,288 B2
(45) Date of Patent: Jun. 25, 2024

(54) FILTER CIRCUIT

(71) Applicant: Fujikura Ltd., Tokyo (JP)

(72) Inventor: Yo Yamaguchi, Sakura (JP)

(73) Assignee: FUJIKURA LTD., Tokyo (JP)

(*) Notice: Subject to any disclaimer, the term of this patent is extended or adjusted under 35 U.S.C. 154(b) by 382 days.

(21) Appl. No.: 17/633,983

(22) PCT Filed: Dec. 17, 2020

(86) PCT No.: PCT/JP2020/047174
§ 371 (c)(1),
(2) Date: Feb. 9, 2022

(87) PCT Pub. No.: WO2022/130570
PCT Pub. Date: Jun. 23, 2022

(65) Prior Publication Data
US 2022/0399626 A1 Dec. 15, 2022

(51) Int. Cl.
*H01P 1/203* (2006.01)
*H03H 7/01* (2006.01)

(52) U.S. Cl.
CPC .......... *H01P 1/203* (2013.01); *H03H 7/0123* (2013.01); *H03H 2007/013* (2013.01)

(58) Field of Classification Search
CPC . H03H 2007/013; H03H 7/0123; H01P 1/203
USPC .................. 333/174, 175, 204, 205
See application file for complete search history.

(56) References Cited

FOREIGN PATENT DOCUMENTS

| CN | 101542925 A | 9/2009 |
|---|---|---|
| CN | 108028641 A | 5/2018 |
| JP | 3-136401 A | 6/1991 |
| JP | 11-031903 A | 2/1999 |
| JP | 11-205007 A | 7/1999 |
| JP | 3309947 B2 | 7/2002 |
| JP | 2004-135257 A | 4/2004 |
| WO | 2008/088144 A1 | 7/2008 |

OTHER PUBLICATIONS

International Search Report dated Mar. 16, 2021, issued in counterpart application No. PCT/JP2020/047174 (2 pages).
(Continued)

*Primary Examiner* — Rakesh B Patel
(74) *Attorney, Agent, or Firm* — WHDA, LLP

(57) ABSTRACT

A filter circuit (1) includes a first transmission line (11), a second transmission line (12) which has an electrical length set to ½ of an electrical length of the first transmission line, a first capacitor (21), a second capacitor (22), and a third capacitor (23). Capacitances of the first capacitor, the second capacitor, and the third capacitor are set in such a manner that a circuit including the first transmission line, the second transmission line, and the first capacitor resonates in series at a predetermined fundamental frequency, a circuit including the first transmission line, the first capacitor, and the second capacitor resonates in parallel at a third harmonic frequency being a tripled frequency of the fundamental frequency, and a circuit including the second transmission line and the third capacitor resonates in series at the third harmonic frequency.

7 Claims, 2 Drawing Sheets

(56) References Cited

OTHER PUBLICATIONS

Figure 1:
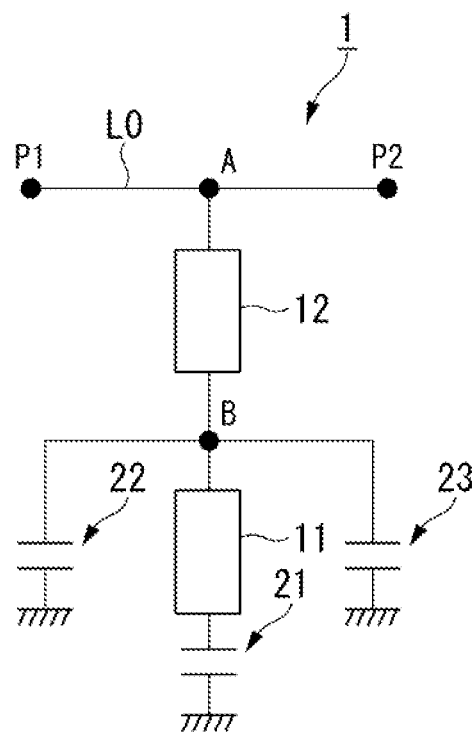

Yamaguchi et al., "A Frequency Doubler MMIC with a Small 2-Band Elimination Filter", IEEE Compound Semiconductor Integrated Circuit Symposium 2004, Oct. 2004, pp. 268-271, cited in ISR (4 pages).

Yamaguchi et al., "An X-band frequency doubler with 2-band elimination filter", IEICE 2003 Electronics Society Conference Proceedings 1, C-2-25, 2003, p. 49, cited in ISR (3 pages).

Yamaguchi et al., "A miniature monolithic filter for a quadrupler", IEICE 2002, Electronics Society Conference Proceedings 1, C-2-50, 2002, p. 72, cited in ISR (3 pages).

FILTER CIRCUIT

TECHNICAL FIELD

The present invention relates to a filter circuit.

BACKGROUND ART

In recent years, radio communication modules for performing radio communication using high-frequency signals such as microwaves and millimeter waves have been actively developed. Such a radio communication module is often implemented as a monolithic microwave integrated circuit (MMIC). By implementing a radio communication module as an MMIC, it is possible to achieve downsizing, a reduction in cost, improvement in reliability, and the like of a radio communication module.

Patent Document 1 to be described below discloses a conventional filter circuit provided in an MMIC. The filter circuit includes a parallel stub connected in parallel to a main line through which high-frequency signals are transmitted, and a capacitance provided between the main line and a ground (grounding potential). The parallel stub includes two stubs being connected in series and having discontinuous characteristic admittances. One end of the parallel stub is connected to the main line, and the other end is an open end. In such a filter circuit, by discontinuously changing the phase of characteristic admittance at a connection point of the two stubs included in the parallel stub, the length of the parallel stub is shortened. In addition, by the capacitance connected in parallel to the main line, the loss of high-frequency signals in a passband is reduced.

PRIOR ART

Patent Document

[Patent Document 1]
Japanese Unexamined Patent Application, First Publication No. H3-136401

DISCLOSURE OF INVENTION

Problems to be Solved by the Invention

Meanwhile, the filter circuit disclosed in Patent Document 1 described above can suppress high-frequency signals in only one frequency band. Thus, for example, in a case where it is necessary to suppress high-frequency signals in two frequency bands, because it is necessary to prepare filter circuits that can suppress high-frequency signals in the respective frequency bands, there is a problem of upsizing of the entire filter circuit.

The present invention has been devised in view of the above-described situations, and an object of the present invention is to provide a compact filter circuit that can suppress high-frequency signals in a plurality of frequency bands.

Means for Solving the Problems

A filter circuit according to an aspect of the present invention includes a first capacitor (21) which has one end connected to a ground, a first transmission line (11) which has one end connected to an other end of the first capacitor, a second transmission line (12) which is connected between an other end of the first transmission line and a main line (L0) by which a high-frequency signal is transmitted, and has an electrical length set to ½ of an electrical length of the first transmission line, and a second capacitor (22) and a third capacitor (23) which are connected between a connection point of the first transmission line and the second transmission line and the ground, in which capacitances of the first capacitor, the second capacitor, and the third capacitor are set in such a manner that a circuit including the first transmission line, the second transmission line, and the first capacitor resonates in series at a predetermined fundamental frequency, a circuit including the first transmission line, the first capacitor, and the second capacitor resonates in parallel at a third harmonic frequency being a tripled frequency of the fundamental frequency, and a circuit including the second transmission line and the third capacitor resonates in series at the third harmonic frequency.

In the filter circuit according to the above-described aspect, a circuit including the first capacitor, the first transmission line, and the second transmission line is provided between the ground and the main line, and the second capacitor and the third capacitor are provided between the connection point of the first transmission line and the second transmission line and the ground. Then, the electrical length of the second transmission line is set to ½ of the electrical length of the first transmission line. In addition, the capacitances of the first capacitor, the second capacitor, and the third capacitor are set as follows.

A circuit including the first transmission line, the second transmission line, and the first capacitor resonates in series at the fundamental frequency A circuit including the first transmission line, the first capacitor, and the second capacitor resonates in parallel at the third harmonic frequency, and a circuit including the second transmission line and the third capacitor resonates in series at the third harmonic frequency.

With this constitution, it is possible to realize a compact filter circuit that can suppress high-frequency signals in a plurality of frequency bands (fundamental frequency and third harmonic frequency).

In the filter circuit according to the above-described aspect, capacitances of the first capacitor, the second capacitor, and the third capacitor may be set in such a manner that a circuit including the first transmission line, the second transmission line, the first capacitor, the second capacitor, and the third capacitor resonates in parallel at a second harmonic frequency being a doubled frequency of the fundamental frequency.

In the filter circuit according to the above-described aspect, a fourth capacitor which has one end connected to the main line, and the other end connected to the ground may be further included.

In the filter circuit according to the above-described aspect, at least one of the first capacitor, the second capacitor, the third capacitor, and the fourth capacitor may be a variable capacitor of which a capacitance is variable.

In the filter circuit according to the above-described aspect, a fifth capacitor which has a capacitance obtained by synthesizing the second capacitor and the third capacitor may be included in place of the second capacitor and the third capacitor.

In the filter circuit according to the above-described aspect, when a characteristic impedance of the first transmission line and the second transmission line is denoted by $Z_1$, the fundamental frequency is denoted by $f1$, an electrical length of the first transmission line at the fundamental frequency is denoted by $\theta_1$ (where, $0<\theta_1<\pi/2$), an electrical length of the second transmission line at the fundamental frequency is denoted by $\theta_2$ (where, $0<\theta_2<\pi/2$), and capacitances of the first capacitor, the second capacitor, and the third capacitor are respectively denoted by $C_1$, $C_2$, and $C_3$, the electrical lengths $\theta_1$ and $\theta_2$ may be set in such a manner as to satisfy the following formula;

(Equation 1)

$$\theta_2 = \frac{1}{2}\theta_1,$$

and
the capacitances $C_1$, $C_2$, and $C_3$ may be set in such a manner as to satisfy the following respective formulae.

(Equation 2)

$$C_1 = \frac{1}{2\pi f_1 Z_1 \tan(\theta_1 + \theta_2)}$$

(Equation 3)

$$C_2 = \frac{1}{6\pi f_1 Z_1 \tan(\theta_1 + \theta_2)}$$

(Equation 4)

$$C_3 = \frac{C_1}{24}(3 - 6\tan^2\theta_2 - \tan^4\theta_2)$$

In the filter circuit according to the above-described aspect, when a synthetic impedance of the first transmission line, the second transmission line, the first capacitor, the second capacitor, and the third capacitor that is viewed from a common connection point of the second transmission line and the fourth capacitor is denoted by $Z_A$, and a capacitance of the fourth capacitor is denoted by $C_4$, the capacitance $C_4$ may be set in such a manner as to satisfy the following formula;

(Equation 5)

$$C_4 = \frac{j}{4\pi f_1 Z_A}$$

(where "j" denotes a square root of −1)

Effects of the Invention

According to one or more aspects of the present invention, a compact filter circuit that can suppress high-frequency signals in a plurality of frequency bands can be provided.

BRIEF DESCRIPTIONS OF DRAWINGS

Figure 2:
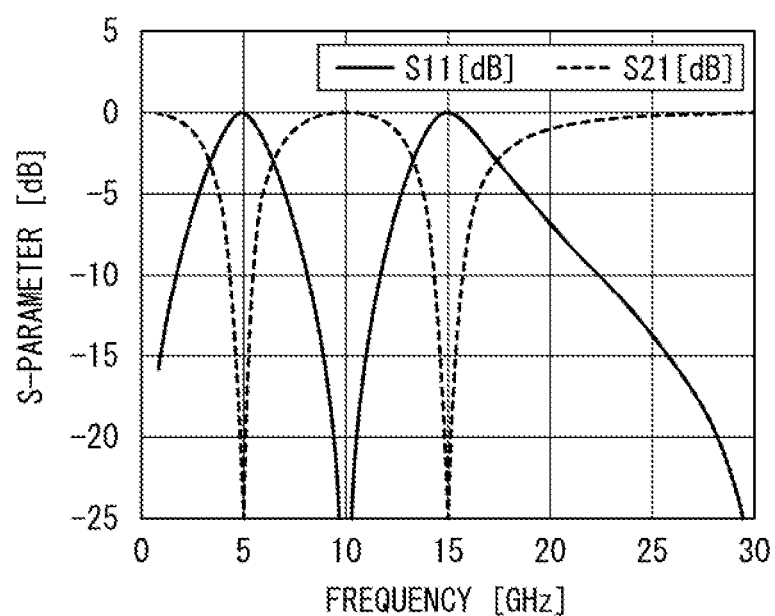
Figure 3:
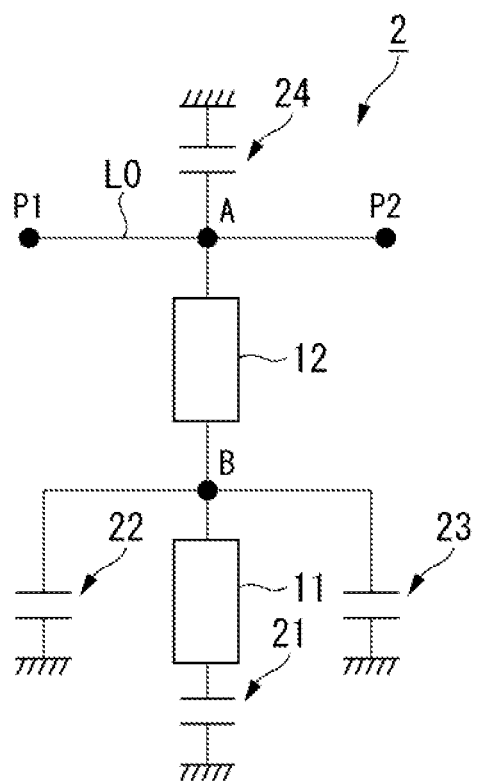
Figure 4:
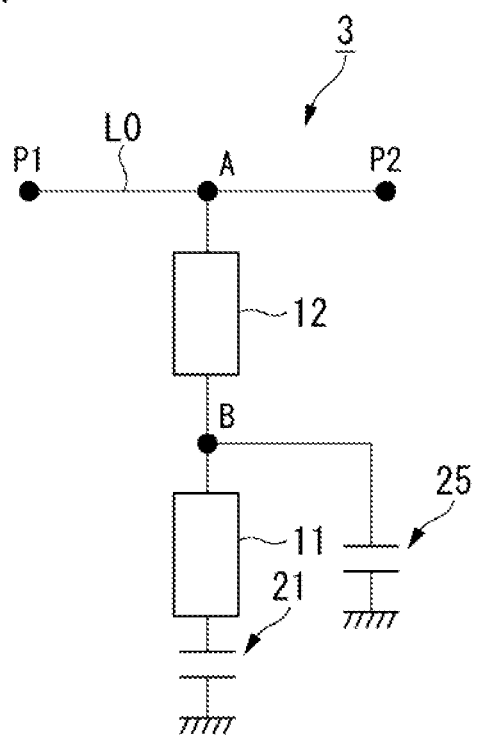

FIG. 1 is a block diagram representing a main part constitution of a filter circuit according to a first embodiment.
FIG. 2 is a diagram representing an example of a frequency characteristic of the filter circuit according to the first embodiment.
FIG. 3 is a block diagram representing a main part constitution of a filter circuit according to a second embodiment.
FIG. 4 is a block diagram representing a main part constitution of a filter circuit according to a third embodiment.

BEST MODE FOR CARRYING OUT THE INVENTION

Hereinafter, a filter circuit according to an embodiment of the present invention will be described in detail with reference to the drawings.

First Embodiment

FIG. 1 is a block diagram representing a main part constitution of a filter circuit according to a first embodiment. As shown in FIG. 1, a filter circuit 1 according to the present embodiment includes a stub (first transmission line) 11, a stub (second transmission line) 12, a capacitor (first capacitor) 21, a capacitor (second capacitor) 22, and a capacitor (third capacitor) 23.

Such a filter circuit 1 performs filtering of high-frequency signals transmitted by a main line L0 (for example, high-frequency signals transmitted from an input-output port P1 toward an input-output port P2). Specifically, the filter circuit 1 suppresses (blocks) signals with a fundamental frequency, and signals with a third harmonic frequency being a tripled frequency of the fundamental frequency that are included in high-frequency signals transmitted by the main line L0, and lets through signals with a second harmonic frequency being a doubled frequency of the fundamental frequency.

The filter circuit 1 is provided as a subsequent circuit following a multiplier circuit (not shown) that doubles a fundamental frequency, for example, and lets through signals with the second harmonic frequency that are generated by the multiplier circuit, and blocks signals with the fundamental frequency that leak from the multiplier circuit, and signals with third harmonic frequency that are generated by the multiplier circuit. Note that the above-described fundamental frequency may be a microwave band (frequency is approximately 3 [GHz] to 30 [GHz]) or may be a millimeter-wave band (frequency is approximately 30 [GHz] to 300 [GHz]), for example.

One end of the capacitor 21 is connected to a ground, and the other end of the capacitor 21 is connected to one end of the stub 11. The one end of the stub 11 is connected to the other end of the capacitor 21, and the other end of the stub 11 is connected to one end of the stub 12. The one end of the stub 12 is connected to the other end of the stub 11, and the other end of the stub 12 is connected to the main line L0. One ends of the capacitors 22 and 23 are connected to the ground, and the other ends of the capacitors 22 and 23 are connected to a connection point of the stubs 11 and 12. Note that, hereinafter, a connection point of the other end of the stub 12 and the main line L0 will be referred to as a "connection point A", and the connection point of the stubs 11 and 12 will be referred to as a "connection point B".

Here, capacitances of the capacitors 21, 22, and 23 are set in such a manner as to satisfy the following conditions (α) to (γ).
  (α) A circuit including the stubs 11 and 12 and the capacitor 21 resonates in series at the fundamental frequency
  (β) A circuit including the stub 11 and the capacitors 21 and 22 resonates in parallel at the third harmonic frequency, and a circuit including the stub 12 and the capacitor 23 resonates in series at the third harmonic frequency
  (γ) A circuit including the stubs 11 and 12 and the capacitors 21, 22, and 23 resonates in parallel at the second harmonic frequency By the above-described condition (α) being satisfied, an impedance of the circuit including the stubs 11 and 12 and the capacitor 21, to signals with the fundamental frequency becomes extremely small (becomes zero or almost zero). As a result, because the connection point A enters a short circuit state, signals with the fundamental frequency that are included in high-frequency signals transmitted by the main line L0 are suppressed by the filter circuit 1.

By the above-described condition (β) being satisfied, an impedance of the circuit including the stub 11 and the capacitors 21 and 22, to signals with the third harmonic frequency becomes extremely large (becomes infinite or almost infinite). In addition, an impedance of the circuit including the stub 12 and the capacitor 23, to signals with the third harmonic frequency becomes extremely small (becomes zero or almost zero). As a result, because the connection point A enters the short circuit state, signals with the third harmonic frequency that are included in high-frequency signals transmitted by the main line L0 are suppressed by the filter circuit 1.

By the above-described condition (γ) being satisfied, an impedance of the circuit including the stubs 11 and 12 and the capacitors 21, 22, and 23 becomes extremely large (becomes infinite or almost infinite). As a result, because the connection point A enters an opened state, signals with the second harmonic frequency that are included in high-frequency signals transmitted by the main line L0 pass through the filter circuit 1 without being suppressed by the filter circuit 1.

Here, a characteristic impedance of the stubs 11 and 12 is denoted by $Z_1$, and the fundamental frequency is denoted by f1. In addition, an electrical length of the stub 11 at the fundamental frequency f1 is denoted by $\theta_1$ (where, $0<\theta_1<\pi/2$), and an electrical length of the stub 12 at the fundamental frequency f1 is denoted by $\theta_2$ (where, $0<\theta_2<\pi/2$). In addition, capacitances of the capacitors 21, 22, and 23 are respectively denoted by $C_1$, $C_2$, and $C_3$.

The electrical length $\theta_1$ of the stub 11 and the electrical length $\theta_2$ of the stub 12 are set in such a manner as to satisfy the following formula (1).

(Equation 6)

$$\theta_2 = \frac{1}{2}\theta_1 \quad (1)$$

In addition, the capacitance $C_1$ of the capacitor 21, the capacitance $C_2$ of the capacitor 22, and the capacitance $C_3$ of the capacitor 23 are set in such a manner as to satisfy the following respective formulae (2), (3), and (4).

(Equation 7)

$$C_1 = \frac{1}{2\pi f_1 Z_1 \tan(\theta_1 + \theta_2)} \quad (2)$$

(Equation 8)

$$C_2 = \frac{1}{6\pi f_1 Z_1 \tan(\theta_1 + \theta_2)} \quad (3)$$

(Equation 9)

$$C_3 = \frac{C_1}{24}(3 - 6\tan^2\theta_2 - \tan^4\theta_2) \quad (4)$$

Here, from the above-described formula (1), the electrical length $\theta_2$ of the stub 12 is set to ½ of the electrical length $\theta_1$ of the stub 11. In other words, in the present embodiment, ⅔ of the total length of stubs connected (connected in parallel) to the main line L0 (the sum of the electrical lengths $\theta_1$ and $\theta_2$ of the stubs 11 and 12) is allocated to the stub 11, and the remaining ⅓ is allocated to the stub 12. Such a constitution is employed for achieving the downsizing of the filter circuit 1 by reducing the total length of stubs connected to the main line L0.

If the electrical lengths of the stubs 11 and 12 are set in such a manner as to satisfy the above-described formula (1), and the capacitances of the capacitors 21, 22, and 23 are set in such a manner as to satisfy the above-described respective formulae (2) to (4), the above-described conditions (A) to (C) (α) to (γ) are satisfied. Thus, the filter circuit 1 shown in FIG. 1 functions in such a manner as to suppress signals with the fundamental frequency f1 and signals with the third harmonic frequency (3*f1) that are included in high-frequency signals transmitted by the main line L0, and let through the signals with the second harmonic frequency (2*f1).

FIG. 2 is a diagram representing an example of a frequency characteristic of the filter circuit according to the first embodiment. A graph shown in FIG. 2 indicates a frequency characteristic obtained by calculation in a case where the fundamental frequency f1 is set to 5 [GHz], the characteristic impedance $Z_1$ is set to 71 [Ω], and the electrical length $\theta_2$ is set to 15 [°]. Note that a horizontal axis of the graph shown in FIG. 2 indicates frequency, and a vertical axis thereof indicates S-parameters. S11 being one of S-parameters indicates a reflection characteristic of the filter circuit 1 that is viewed from the input-output port P1, and S21 being one of S-parameters indicates a transmission characteristic of the filter circuit 1 in a direction heading for the input-output port P2 from the input-output port P1.

Referring to S11 in the graph shown in FIG. 2, it can be seen that a value becomes extremely large at 5 [GHz] being the fundamental frequency and 15 [GHz] being the third harmonic frequency, and a value becomes extremely small at 10 [GHz] being the second harmonic frequency. In contrast to this, referring to S21 in the graph shown in FIG. 2, it can be seen that a value becomes extremely small at 5 [GHz] being the fundamental frequency and 15 [GHz] being the third harmonic frequency, and a value becomes extremely large at 10 [GHz] being the second harmonic frequency, contrary to S11.

From the above points, it can be seen that signals with 5 [GHz] being the fundamental frequency and signals with 15 [GHz] being the third harmonic frequency are dramatically suppressed (blocked) by the filter circuit 1. In contrast to this, it can be seen that signals with 10 [GHz] being the second harmonic frequency pass through the filter circuit 1 without being suppressed by the filter circuit 1.

As described above, in the present embodiment, a circuit including the capacitor 21, the stub 11, and the stub 12 is provided between the ground and the main line L0, and the capacitors 22 and 23 are provided between the connection point (the connection point B) of the stubs 11 and 12 and the ground. Then, an electrical length of the stub 12 is set to ½ of an electrical length of the stub 11. In addition, capacitances of the capacitors 21, 22, and 23 are set in such a manner that a circuit including the capacitor 21 and the stubs 11 and 12 resonates in series at the fundamental frequency, a circuit including the stub 11 and the capacitors 21 and 22 resonates in parallel at the third harmonic frequency, and a circuit including the stub 12 and the capacitor 23 resonates in series at the third harmonic frequency. With this constitution, it is possible to realize a compact filter circuit that can suppress high-frequency signals in a plurality of frequency bands (fundamental frequency and third harmonic frequency).

Second Embodiment

FIG. 3 is a block diagram representing a main part constitution of a filter circuit according to a second embodiment. As shown in FIG. 3, a filter circuit 2 according to the present embodiment has a constitution obtained by adding a capacitor (fourth capacitor) 24 to the filter circuit 1 shown in FIG. 1.

One end of the capacitor 24 is connected to the ground, and the other end of the capacitor 24 is connected to a connection point A. Such a capacitor 24 is provided for reducing the loss of signals with the second harmonic frequency in a passband of the filter circuit 2, and surely letting through signals with the second harmonic frequency. Note that the passband of the filter circuit 2 is similar to the passband of the filter circuit 1.

Here, an impedance (synthetic impedance) of a circuit including stubs 11 and 12 and capacitors 21, 22, and 23, to signals with the second harmonic frequency that is viewed from the connection point A (common connection point) is denoted by $Z_A$, and a capacitance of the capacitor 24 is denoted by $C_4$. The capacitance $C_4$ is set in such a manner as to satisfy the following formula (5).

(Equation 10)

$$C_4 = \frac{j}{4\pi f_1 Z_A} \quad (5)$$

(where "j" denotes a square root of −1)

In a case where the capacitance of the capacitor 24 is set in such a manner as to satisfy the above-described formula (5), the capacitor 24 connected to the connection point A, and the circuit including the stubs 11 and 12 and the capacitors 21, 22, and 23 that is connected to the connection point A resonate (resonate in parallel). With this constitution, because the connection point A surely enters an opened state, signals with the second harmonic frequency surely pass through the filter circuit 2.

As described above, in the present embodiment, similarly to the filter circuit 1 shown in FIG. 1, a circuit including the capacitor 21, the stub 11, and the stub 12 is provided between the ground and the main line L0, and the capacitors 22 and 23 are provided between the connection point (the connection point B) of the stubs 11 and 12 and the ground. Then, an electrical length of the stub 12 is set to ½ of an electrical length of the stub 11. In addition, capacitances of the capacitors 21, 22, and 23 are set in such a manner that a circuit including the capacitor 21 and the stubs 11 and 12 resonates in series at the fundamental frequency, a circuit including the stub 11 and the capacitors 21 and 22 resonates in parallel at the third harmonic frequency, and a circuit including the stub 12 and the capacitor 23 resonates in series at the third harmonic frequency. With this constitution, it is possible to realize a compact filter circuit that can suppress high-frequency signals in a plurality of frequency bands (fundamental frequency and third harmonic frequency).

Moreover, in the present embodiment, the capacitor 24 is provided between the connection point A and the ground. With this constitution, because the circuit including the stubs 11 and 12 and the capacitors 21, 22, and 23 that is connected to the connection point A, and the capacitor 24 resonate, and the connection point A surely enters the opened state, signals with the second harmonic frequency can surely pass.

Third Embodiment

FIG. 4 is a block diagram representing a main part constitution of a filter circuit according to a third embodiment. As shown in FIG. 4, a filter circuit 3 according to the present embodiment has a constitution in which a capacitor 25 is provided in place of the capacitors 22 and 23 of the filter circuit 1 shown in FIG. 1. Such a filter circuit 3 is provided for achieving the simplification of element arrangement by reducing the number of capacitors of the filter circuit 1 shown in FIG. 1.

One end of the capacitor 25 is connected to the ground, and the other end of the capacitor 25 is connected to a connection point B. The capacitor 25 has a capacitance obtained by synthesizing the capacitors 22 and 23 shown in FIG. 1. More specifically, the capacitor 25 has a capacitance obtained by adding a capacitance $C_2$ represented by the above-described formula (3), and a capacitance $C_3$ represented by the above-described formula (4).

The filter circuit 3 according to the present embodiment includes the capacitor 25 having a capacitance obtained by synthesizing the capacitors 22 and 23 shown in FIG. 1 that is provided between the ground and the connection point B, and is electrically equivalent to the filter circuit 1 shown in FIG. 1. Thus, similarly to the filter circuit 1 according to the first embodiment, the filter circuit 3 can suppress high-frequency signals in a plurality of frequency bands (fundamental frequency and third harmonic frequency). In addition, in the present embodiment, the two capacitors 22 and 23 included in the filter circuit 1 are implemented by one capacitor 25. With this constitution, the simplification of element arrangement can be achieved as compared with the filter circuit 1 according to the first embodiment.

Note that the filter circuit 3 according to the present embodiment has a constitution in which the two capacitors 22 and 23 included in the filter circuit 1 according to the first embodiment that is shown in FIG. 1 are replaced with the one capacitor 25. Nevertheless, the two capacitors 22 and 23 included in the filter circuit 2 according to the second embodiment that is shown in FIG. 2 may be similarly replaced with the one capacitor 25.

Heretofore, the embodiments have been described, but the present invention is not limited to the above-described embodiments, and can be freely changed within the scope of the present invention. For example, a part or all of the capacitors 21 to 25 described in the above-described embodiments may be implemented by a variable capacitor of which a capacitance is variable.

DESCRIPTION OF THE REFERENCE SYMBOLS 1 to 3: Filter circuit
11, 12: Stub
21 to 25: Capacitor
L0: Main line

The invention claimed is:
1. A filter circuit comprising:
a first capacitor which has one end connected to a ground;
a first transmission line which has one end connected to an other end of the first capacitor;

a second transmission line which is connected between an other end of the first transmission line and a main line by which a high-frequency signal is transmitted, and has an electrical length set to ½ of an electrical length of the first transmission line; and a second capacitor and a third capacitor which are connected between a connection point of the first transmission line and the second transmission line and the ground, wherein capacitances of the first capacitor, the second capacitor, and the third capacitor are set in such a manner that a circuit including the first transmission line, the second transmission line, and the first capacitor resonates in series at a predetermined fundamental frequency, a circuit including the first transmission line, the first capacitor, and the second capacitor resonates in parallel at a third harmonic frequency being a tripled frequency of the fundamental frequency, and a circuit including the second transmission line and the third capacitor resonates in series at the third harmonic frequency.

2. The filter circuit according to claim 1, wherein capacitances of the first capacitor, the second capacitor, and the third capacitor are set in such a manner that a circuit including the first transmission line, the second transmission line, the first capacitor, the second capacitor, and the third capacitor resonates in parallel at a second harmonic frequency being a doubled frequency of the fundamental frequency.

3. The filter circuit according to claim 2, wherein, when a characteristic impedance of the first transmission line and the second transmission line is denoted by $Z_1$, the fundamental frequency is denoted by f1, an electrical length of the first transmission line at the fundamental frequency is denoted by $\theta_1$ (where, $0<\theta_1<\pi/2$), an electrical length of the second transmission line at the fundamental frequency is denoted by $\theta_2$ (where, $0<\theta_2<\pi/2$), and capacitances of the first capacitor, the second capacitor, and the third capacitor are respectively denoted by $C_1$, $C_2$, and $C_3$, the electrical lengths $\theta_1$ and $\theta_2$ are set in such a manner as to satisfy the following formula;

(Equation 1)

$$\theta_2 = \frac{1}{2}\theta_1,$$

and the capacitances $C_1$, $C_2$, and $C_3$ are set in such a manner as to satisfy the following respective formulae.

(Equation 2)

$$C_1 = \frac{1}{2\pi f_1 Z_1 \tan(\theta_1 + \theta_2)}$$

(Equation 3)

$$C_2 = \frac{1}{6\pi f_1 Z_1 \tan(\theta_1 + \theta_2)}$$

(Equation 4)

$$C_3 = \frac{C_1}{24}(3 - 6\tan^2\theta_2 - \tan^4\theta_2)$$

4. The filter circuit according to claim 1, comprising a fifth capacitor which has a capacitance obtained by synthesizing the second capacitor and the third capacitor, in place of the second capacitor and the third capacitor.

5. The filter circuit according to claim 1, further comprising a fourth capacitor which has one end connected to the main line, and an other end connected to the ground.

6. The filter circuit according to claim 5, wherein at least one of the first capacitor, the second capacitor, the third capacitor, and the fourth capacitor is a variable capacitor of which a capacitance thereof is variable.

7. The filter circuit according to claim 5, wherein, when a synthetic impedance of the first transmission line, the second transmission line, the first capacitor, the second capacitor, and the third capacitor that is viewed from a common connection point of the second transmission line and the fourth capacitor is denoted by $Z_A$, and a capacitance of the fourth capacitor is denoted by $C_4$, the capacitance $C_4$ is set in such a manner as to satisfy the following formula;

(Equation 5)

$$C_4 = \frac{j}{4\pi f_1 Z_A}$$

(where "j" denotes a square root of −1).

* * * * *